United States Patent
Tatsumi

(10) Patent No.: US 7,439,068 B2
(45) Date of Patent: Oct. 21, 2008

(54) PLASMA MONITORING METHOD, PLASMA PROCESSING METHOD, METHOD OF MANUFACTURING SEMICONDUCTOR DEVICE, AND PLASMA PROCESSING SYSTEM

(75) Inventor: Tetsuya Tatsumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 901 days.

(21) Appl. No.: 10/877,391

(22) Filed: Jun. 25, 2004

(65) Prior Publication Data

US 2005/0019962 A1    Jan. 27, 2005

(30) Foreign Application Priority Data

Jul. 16, 2003  (JP) ............................ P2003-275124

(51) Int. Cl.
 *G01N 33/00* (2006.01)
 *G01N 35/08* (2006.01)
 *H01L 21/00* (2006.01)
(52) U.S. Cl. ................ 436/34; 436/55; 438/5; 438/8; 438/9
(58) Field of Classification Search ............. None
 See application file for complete search history.

(56) References Cited

OTHER PUBLICATIONS

Benissad et al. "Silicon dioxide deposition in a microwave plasma reactor", Surface and Coating Technology, 1999, v. 116-119, pp. 868-873.*

Macko et al. "Time resolved O2 (b1Σ+g) rotational temperature measurements in a low-pressure oxygen pulsed discharge; simple and quick method for temperature determination", J. Phys. D: Appl. Phys., 1999, v. 32, pp. 246-250.*

Jašik et al. "Time resolves actinometric study of pulsed RF oxygen discharge", Czechoslovak J. Phys., 2004, v. 54, No. 6, pp. 661-676.*

Taylor et al. "Control of dissociation by varying oxygen pressure in noble gas admixtures for plasma processing", J. Vas. Sci. Technol. A, 2005, v. 23, No. 4, pp. 643-650.*

Nakano "Some recent topics in non-equilibrium discharge plasma technologies—their widespread use from low pressure to atmospheric pressure", IEEE Transaction on Dielectric and Electrical Insulation, 2007, v. 14, No. 5, pp. 1081-1087.*

* cited by examiner

*Primary Examiner*—Yelena G Gakh
(74) *Attorney, Agent, or Firm*—Sonnenschein Nath & Rosenthal LLP

(57) ABSTRACT

Disclosed is a plasma monitoring method for detecting the amount of atomic radicals generated by dissociation of a molecular raw material gas during a plasma processing conducted by introducing the molecular raw material gas and a rare gas into a process atmosphere, wherein the amount of the atomic radicals is predicted from the dissociation degree of the molecular raw material gas determined from the partial pressure of the molecular raw material gas in the process atmosphere, the luminous intensity of the rare gas, and the partial pressure of the rare gas in the process atmosphere, whereby the amount of the specific atomic radicals can be monitored easily and accurately.

5 Claims, 7 Drawing Sheets

PLASMA MONITORING METHOD, PLASMA PROCESSING METHOD, METHOD OF MANUFACTURING SEMICONDUCTOR DEVICE, AND PLASMA PROCESSING SYSTEM

BACKGROUND OF THE INVENTION

The present invention relates to a plasma monitoring method, a plasma processing method, a method of manufacturing a semiconductor device, and a plasma processing system by which it is possible to detect specified radicals with high accuracy.

In the development of ULSI devices in recent years, a variety of investigations have been made by companies, with realization of higher operating speeds and lower power consumptions kept in mind. In these circumstances, the multi-layer wiring technology using low-dielectric-constant material films (the so-called low-k films) and copper (Cu) has come into general use, and securing a high wiring reliability has come to be a very important problem.

For example, in the process of using an SiOCH-based low-dielectric-constant material to form an inter-layer insulation film, as shown in FIG. 6A, an SiOCH-based film 102 and an $SiO_2$ film 103 sequentially formed on a substrate 101 are provided with a groove 105 by etching by using a mask composed of a resist 104, and thereafter an ashing step for removing the resist 105 is performed. In the ashing step, an ashing damage may be exerted on the SiOCH-based film 102, and an oxide layer 106 may be formed on the side surfaces of the groove 105. This is considered to be because the material constituting the SiOCH-based film 102 itself is very instable, and oxidation thereof will easily proceed due to the presence of an excess of oxygen (O) radicals and the like. It has been reported that, when a wet treatment is conducted as an after-treatment under the condition where the ashing damage is exerted, as shown in FIG. 6B, the oxide layer 106 is cut, to generate unrequited size conversion differences, steps at the side walls of the groove 105 or the like, resulting in that a Cu wiring (omitted in the figure) embedded in the groove 105 cannot have the desired characteristics.

In the above-mentioned ashing step, therefore, it is demanded to establish a technique of suppressing the ashing damage while removing the resist pattern composed of an organic material. For this purpose, it is necessary to accurately monitor the amount of the oxygen (O) radicals during the ashing step.

Conventionally, the actinometric method has been applied to the monitoring of the O radical amount. The actinometric method is a method in which the absolute value of the O radical amount is determined from the ratio between the luminous intensity of oxygen and the luminous intensity of argon (Ar), which is introduced together with oxygen (see "Plasma Source Sci. Technol.", (England), 1994, Vol. 3, pp. 154-161).

In the above-mentioned actinometric method, however, it has been impossible to accurately monitor the O radical amount. FIG. 7 shows a graph in which the amount of oxygen radicals determined by the actinometric method is taken on the axis of abscissas, and the ashing rate of the resist is taken on the axis of ordinates. Here, the ashing rate of the resist is expected to be proportional to the O radical amount. However, the O radical concentration actually determined by the actinometric method is not proportional to the ashing rate; thus, it is seen that accurate monitoring of the O radical concentration is not achieved.

This is because, on one hand, the luminous intensity of oxygen (wavelength $\lambda=777$ nm) ordinarily measured includes not only the luminescence of the O atomic radicals but also the dissociational luminescence of oxygen molecules ($O_2$), but, on the other hand, in the actinometric method the O radical concentration is determined by regarding the luminous intensity at the wavelength $\lambda=777$ nm measured as the luminescence relevant only to the O radicals.

SUMMARY OF THE INVENTION

To attain the above object, in accordance with one aspect of the present invention, there is provided a plasma monitoring method for detecting the amount of atomic radicals generated by dissociation of a molecular raw material gas during a plasma processing conducted by introducing the molecular raw material gas and a rare gas into a process atmosphere, the method including the steps of: determining the dissociation degree of the molecular raw material gas from the partial pressure of the molecular raw material gas in the process atmosphere, the luminous intensity of the rare gas, and the partial pressure of the rare gas in the process atmosphere; and predicting the amount of the atomic radicals from the dissociation degree.

Intrinsically, the amount of the atomic radicals should be proportional to the processing rate. It has just found out, in the process of making the present invention, that the dissociation degree of the molecular raw material gas shows very good proportionality to the processing rate in the plasma processing.

Specifically, the dissociation degree of the molecular raw material gas is determined as $E=P1\times(I/P2)$, where P1 is the partial pressure of the molecular raw material gas in the process atmosphere, I is the luminous intensity of the rare gas, and P2 is the partial pressure of the rare gas in the process atmosphere. FIG. 1 shows a graph in which the dissociation degree E of the oxygen molecule gas thus determined is taken on the axis of abscissas, and the ashing rate (processing rate) is taken on the axis of ordinates, in the case of the ashing treatment (plasma processing) in which the oxygen molecule gas is used as the molecular raw material gas and argon is used as the rare gas. As shown in the graph, it is seen that the dissociation degree E determined according to the present invention has highly accurate values showing a very good proportionality to the ashing rate (i.e., the amount of oxygen radicals).

Therefore, by predicting the amount of atomic radicals from the dissociation degree showing the very good proportionality to the processing rate, it is possible to accurately predict the atomic radical amount, independently of dissociational luminescence and other luminescence factors.

In accordance with another aspect of the present invention, there is provided a plasma processing method including the step of controlling process conditions so as to bring the atomic radical amount, determined by the above plasma monitoring method, to a predetermined atomic radical amount. In accordance with a further aspect of the present invention, there is provided a method of manufacturing a semiconductor device, including the step of processing a surface of a substrate by such a plasma processing.

In the plasma processing method, the plasma processing is conducted while accurately controlling the amount of the atomic radicals in the process atmosphere. Therefore, the processing is performed while preventing the generation of an excess of radicals and accurately controlling the processing rate.

In the method of manufacturing a semiconductor device in which such a plasma processing is conducted, the processing is performed while preventing a damage from being generated due to an excess of radicals and while accurately controlling the processing rate, whereby a processing with good shape accuracy is achieved.

In accordance with yet another aspect of the present invention, there is provided a plasma processing system for performing the above-mentioned plasma processing method, the system including a process chamber in which to perform a plasma processing, and luminescence detection means for detecting luminescence at a specified wavelength in the process chamber. The plasma processing system further includes a computational unit for determining the amount of atomic radicals of the atoms generated by dissociation of a molecular raw material gas, from the luminous intensity of the rare gas measured by the luminescence detection means, the density of the rare gas in the process chamber, and the partial pressure of the molecular raw material gas in the process chamber, and process control means for controlling process conditions based on the amount of atomic radicals determined by the computational unit.

According to the plasma processing system configured as above, the above-mentioned plasma processing according to the present invention is achieved.

As has been described above, according to the plasma monitoring method of the present invention, the amount of atomic radicals is predicted from the dissociation degree which shows very good proportionality to the processing rate, whereby it is possible to accurately predict the atomic radical amount, independently of dissociational luminescence and other luminescence factors. In addition, according to the plasma processing method of the present invention, process conditions are controlled based on the atomic radical amount predicated by such a monitoring method, whereby the processing can be performed while preventing the generation of an excess of radicals and while accurately controlling the processing rate. Besides, according to the method of manufacturing a semiconductor device according to the present invention by performing such a plasma processing method, the processing is conducted while preventing a damage from being exerted due to an excess of radicals and while accurately controlling the processing rate, whereby a processing with good shape accuracy can be achieved. Furthermore, according to the plasma processing system of the present invention, the above-mentioned plasma processing according to the present invention can be carried out.

Thus, according to the present invention, it is possible to accurately predicted the amount of atomic radicals which will be generated. Therefore, the present invention is widely applicable to manufacturing methods in which a highly accurate plasma processing is conducted.

BRIEF DESCRIPTION OF THE DRAWINGS

The above and other objects, features and advantages of the present invention will become apparent from the following description and appended claims, taken in conjunction with the accompanying drawings, in which:

DETAILED DESCRIPTION OF THE PREFERRED EMBODIMENTS

Figure 1:
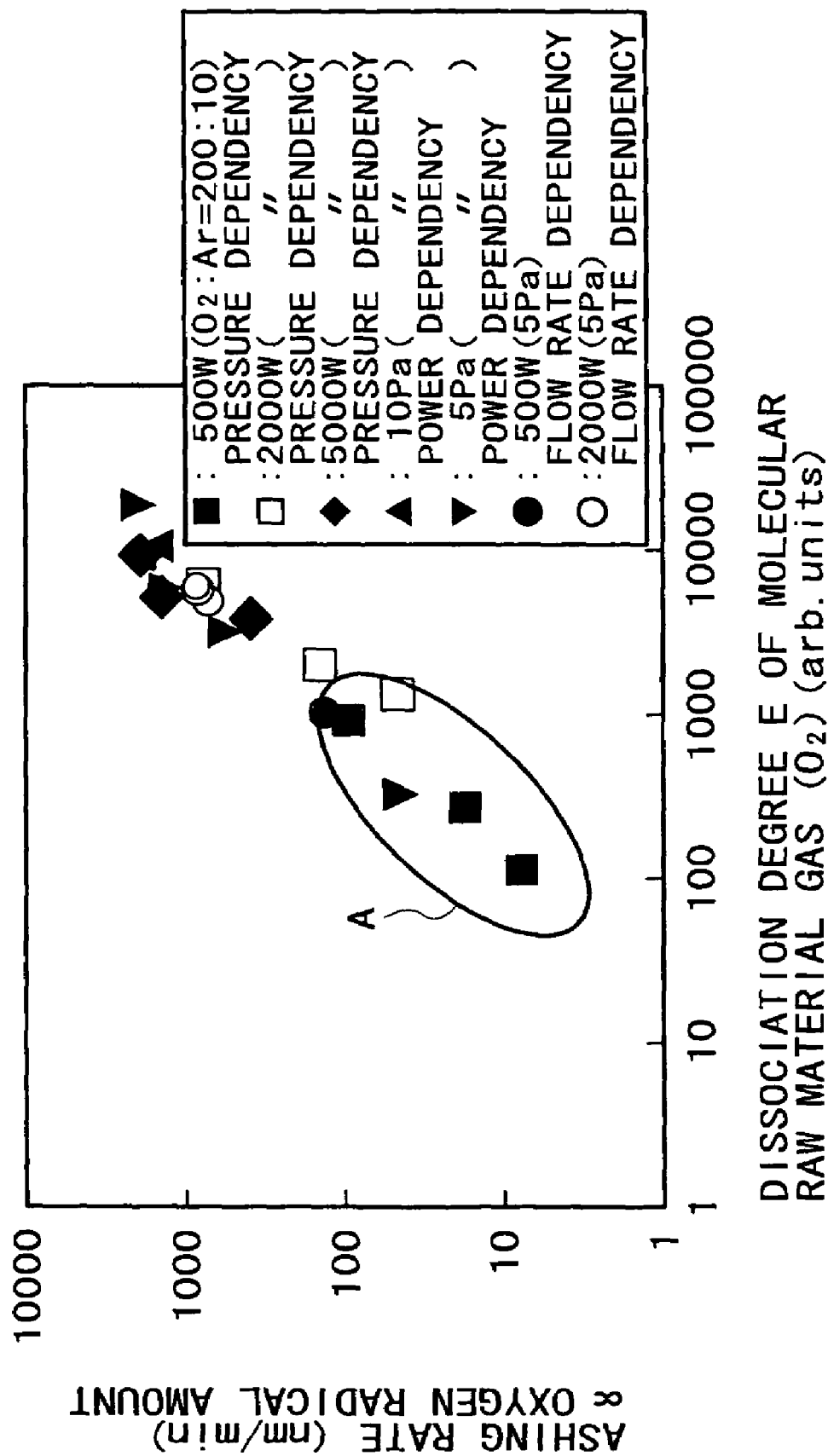
FIG. 1 is a graph showing the relationship between the dissociation degree of a molecular raw material gas and the processing rate which is proportional to the atomic radical amount.

Now, embodiments of the present invention will be sequentially described in detail below, starting with the plasma processing method.

<Plasma Monitoring Method>

The plasma monitoring method described in this embodiment is a plasma monitoring method for detecting the amount of atomic radicals generated by dissociation of a molecular raw material gas during a plasma processing conducted by introducing the molecular raw material gas and a rare gas into a process atmosphere.

Here, examples of the molecular raw material gas include oxygen molecules ($O_2$), hydrogen molecules ($H_2$), nitrogen molecules ($N_2$), water ($H_2O$), and ammonia ($NH_3$), among which a gas according to the purpose of the plasma processing is used.

On the other hand, examples of the rare gas include helium (He), neon (Ne), argon (Ar), krypton (Kr), and xenon (Xe), from which a gas is selected according to the molecular raw material gas. Particularly, in the plasma processing pertaining to the monitoring method in this embodiment, one of rare gases which has a luminescence collision cross section for permitting luminescence with the energy given in the case of obtaining atomic radicals by dissociation of the molecular raw material gas is used. Furthermore, the rare gas to be used, preferably, has a luminescence collision cross section close to the dissociation collision cross section of the molecular raw material gas. Herein, the luminescence collision cross section means the probability of the collision of electrons with atoms or molecules with the result of light emission, and is a function of energy. Similarly, the dissociation collision cross section means the probability of the collision of electrons with the molecules with the result of dissociation of the molecules, and is a function of energy.

At the time of the plasma processing, first, the luminous intensity IAr of the rare gas (for example, Ar here) in the process atmosphere is measured. In this case, only the luminous intensity IAr of a specified rare gas is measured by use of a luminescence detector and a spectroscope. Besides, the partial pressure $PO_2$ (P2) of the molecular raw material gas (for example, oxygen molecules $O_2$ here) introduced into the process atmosphere and the partial pressure PAr (P1) of the rare gas introduced into the process atmosphere are determined. These partial pressures $PO_2$ and PAr are determined from the flow rate of the rare gas introduced into the process atmosphere, the flow rate of the molecular raw material gas introduced into the process atmosphere, and the pressure of the process atmosphere.

Then, the dissociation degree $EO_2$ of the molecular raw material gas ($O_2$) is determined from the luminous intensity IAr of the rare gas, the partial pressure $PO_2$ of the molecular raw material gas, and the partial pressure PAr of the rare gas, by the following formula (1):

$$EO_2 = PO_2 \times (IAr/PAr) \quad (1)$$

Here, the luminous intensity IAr of the rare gas (Ar), which is not dissociated, can be expressed as the following formula (2):

$$IAr = PAr \cdot Ne < \sigma Ar \cdot v > \quad (2)$$

by use of the partial pressure PAr of the rare gas, the electron density Ne, the above-mentioned luminescence collision cross section σ Ar, and the electron energy v. From the formula (2), (IAr/PAr) in the formula (1) will be (IAr/PAr) =Ne<σAr·v>.

On the other hand, the dissociation of the molecular raw material gas ($O_2$) is also a phenomenon caused by the collision of electrons, like the above-mentioned luminescence, and the dissociation degree $EO_2$ can be expressed by the following formula (3):

$$EO_2 = PO_2 \cdot Ne < \sigma O_2 \cdot v > \quad (3)$$

by use of the partial pressure $PO_2$ of the molecular raw material gas, the electron density Ne, the above-mentioned dissociation collision cross section σ $O_2$, and the electron energy v.

Then, by regarding the dissociation collision cross section σ $O_2$ of the molecular raw material gas during the plasma processing as equivalent to the luminescence collision cross section σAr of the rare gas, Ne<σ$O_2$·v>in the formula (3) is substituted by Ne<σAr·v>=(IAr/PAr), whereupon the above formula (1) is obtained. In order to thus regard the dissociation collision cross section σ$O_2$ of the molecular raw material gas during the plasma processing as equivalent to the luminescence collision cross section σ Ar of the rare gas, a rare gas having a luminescence collision cross section close to the dissociation collision cross section of the molecular raw material gas is selected, whereby the accuracy of the numerical value of the dissociation degree $EO_2$ of the molecular raw material gas is further enhanced.

Then, the amount of atomic radicals generated by dissociation of the molecular raw material gas is predicted from the dissociation degree $EO_2$ of the molecular raw material gas determined as above-mentioned.

FIG. 1 shows a graph in which the dissociation amount E ($EO_2$) determined as above-mentioned is taken on the axis of abscissas and the ashing rate proportional to the O radical amount is taken on the axis of ordinates, for the ashing treatment (plasma processing) in the case of using oxygen molecule gas ($O_2$) as the molecular raw material gas and argon (Ar) as the rare gas. Incidentally, factors (pressure, power, flow rate) among process conditions in the ashing treatment were varied in the following ranges:

Gas flow rates: $O_2$/Ar=200/10 sccm to 5000/250 sccm
Process atmosphere pressure: 1 to 100 Pa
HF power (Power): 500 to 5000 W, with the substrate temperature being 30° C.

As shown in the graph, it is seen that the dissociation amount E determined according to the present invention has highly accurate values showing very good proportionality to the ashing rate (hence, to the oxygen radical amount). Therefore, the O radical amount (the atomic radical amount) can be predicted with a very high accuracy from the thus obtained dissociation amount E.

<Plasma Processing Method>

Then, in the plasma processing method in this embodiment, the plasma processing is carried out while accurately controlling the amount of radicals in the process atmosphere based on the atomic radical amount, for example, the oxygen (O) radical amount predicted by the above-described plasma monitoring method. In this case, process conditions are controlled so as to attain a preset atomic radical amount, or a predetermined processing rate.

This results in that the radical amount (processing rate) is controlled based on the radical amount (processing rate) predicted with high accuracy, whereby it is possible to perform a plasma processing in which the generation of an excess of radicals is prevented and the processing rate is accurately controlled. As a result, the plasma processing can be performed with, for example, good shape accuracy, through prevention of damages due to an excess of radicals and through a highly accurate control of the processing amount.

<Plasma Processing System>

Figure 2:
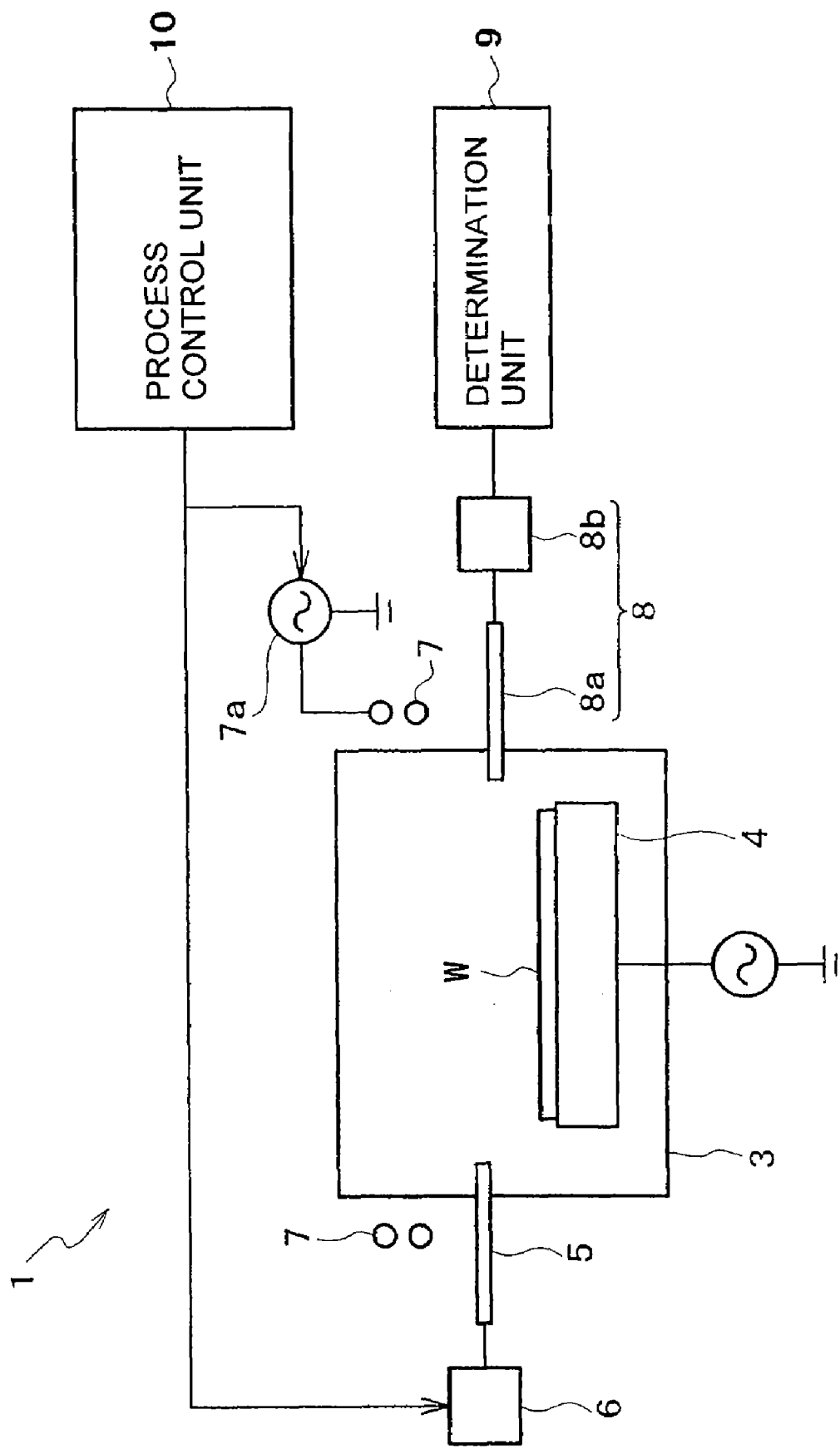
FIG. 2 shows the configuration of a plasma processing system according to an embodiment of the present invention.

FIG. 2 shows the configuration of an example of the plasma processing system for carrying out the above-described plasma processing method. Next, referring to this figure, an embodiment of the plasma processing system will be described.

The plasma processing system 1 shown in the figure comprises a process chamber 3 in which to carry out the plasma processing. In the process chamber 3, a stage 4 on which to mount a substrate W to be treated, and a voltage is impressed on the stage 4. In the process chamber 3, in addition, a gas inlet pipe 5 for introducing a process gas into the process chamber 3 is provided, and the gas inlet pipe 5 is provided with a flow rate control unit 6 for introducing a plurality of gases at predetermined flow rates into the process chamber 3. Further, a coil 7 for generating a plasma inside the process chamber 3 is disposed around the process chamber 3. Incidentally, the above configuration is the same as that of an ordinary plasma processing system, and the configuration of the plasma processing system is not limited to this configuration, inasmuch as the plasma processing can be carried out in the process chamber 3.

In the plasma processing system 1, further, luminescence detection means 8 is provided for detecting luminescence at a specified wavelength in the process chamber 3. The luminescence detection means 8 is composed of a luminescence detection unit 8a for detecting luminescence in the process chamber 3, and a spectroscopic unit 8b for the light detected by the luminescence detection unit 8a.

The computational unit 9 is connected to the spectroscopic unit 8b. The computational unit 9 is for determining the dissociation degree E of a molecular raw material gas from the partial pressure P1 of the molecular raw material gas in the process chamber 3, the luminous intensity I of a rare gas measured by the luminescence detection means 8, and the partial pressure P2 of the rare gas in the process chamber 3, and calculates the dissociation degree E as has been described in the plasma monitoring method above. Incidentally, the computational unit 9 is supplied with information about the partial pressure P1 of the molecular raw material gas in the process chamber 3 and the partial pressure P2 of the rare gas in the process chamber 3, from process control means 10 which will be described below.

The process control means 10 connected to the computational unit 9 is connected to a power source 7a for the coil 7, the flow rate control unit 6, and to an exhaust unit for the process chamber 3 and external input means which are omitted in the figure. By regulating the power source 7a and the flow rate control unit 6, process conditions are controlled based on the atomic radical amount which is predicted from the dissociation degree E determined by the computational unit 9. The process conditions to be controlled here are, for example, the gas flow rates controlled by the flow rate control unit 6, the pressure inside the process chamber 3, and the HF power (Power) impressed from the power source 7a. In this case, the process conditions are so controlled that the atomic radical amount is brought to a predetermined atomic radical amount which is set by inputting through the external input means.

According to the plasma processing system 1 as above, the molecular raw material gas and the rare gas are introduced through the gas inlet pipe 5 into the process chamber 3 at respectively controlled flow rates, whereby it is possible to carry out a plasma processing in which the radical amount is accurately controlled as above-mentioned.

<Semiconductor Device Manufacturing Method-1>

Here, an embodiment in which the above-described plasma processing method is applied to the case of forming a hole in an SiOCH film 33 used as a low-dielectric-constant film will be described as a first example of the manufacturing method.

Figure 3A:
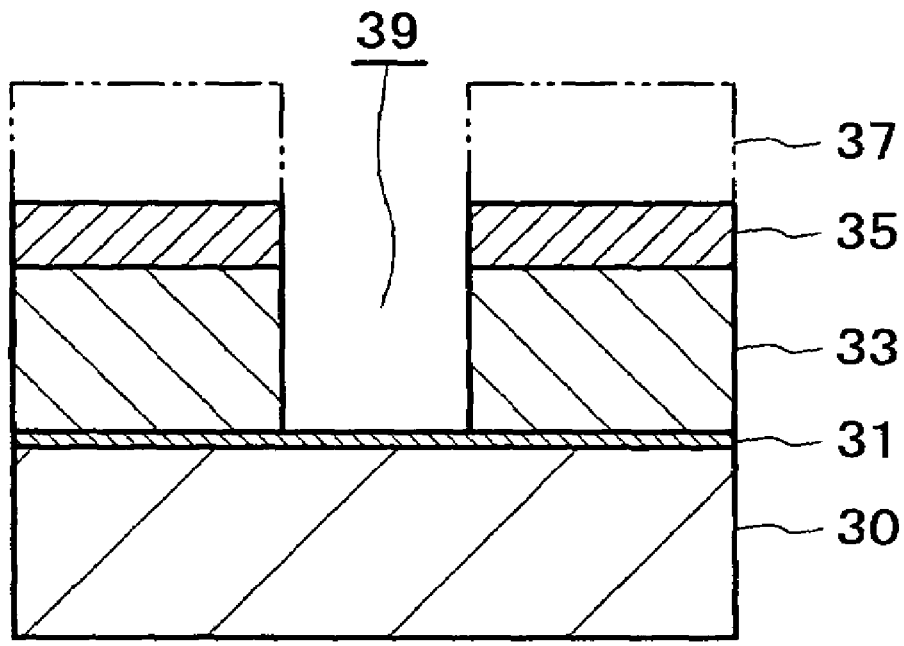
FIGS. 3A and 3B are sectional step diagrams illustrating a first embodiment and a second embodiment of the method of manufacturing a semiconductor device according to the present invention.

First, as shown in FIG. 3A, an SiOCH film 33 is formed on a substrate 30, with an SiC film 31 therebetween, and an $SiO_2$ film 35 is formed thereon. Then, the $SiO_2$ film 35 and the SiOCH film 33 are provided with a hole 39 by etching by use of a mask composed of a resist 37. Thereafter, an ashing treatment for removing the resist 37 used to constitute the mask is conducted as a plasma processing.

In the ashing treatment, oxygen molecules ($O_2$) are used as the molecular raw material gas, and argon (Ar) is used as the rare gas. Then, the dissociation amount $EO_2$ of the oxygen molecules ($O_2$) is determined, and the ashing treatment is carried out while controlling process conditions so as to attain a condition in region A (see FIG. 1) where the ashing rate (O radical amount) predicted from the dissociation amount $EO_2$ is small. By carrying out the ashing treatment while controlling the process conditions in this manner, damages due to an excess of O radicals are suppressed.

Figure 3B:
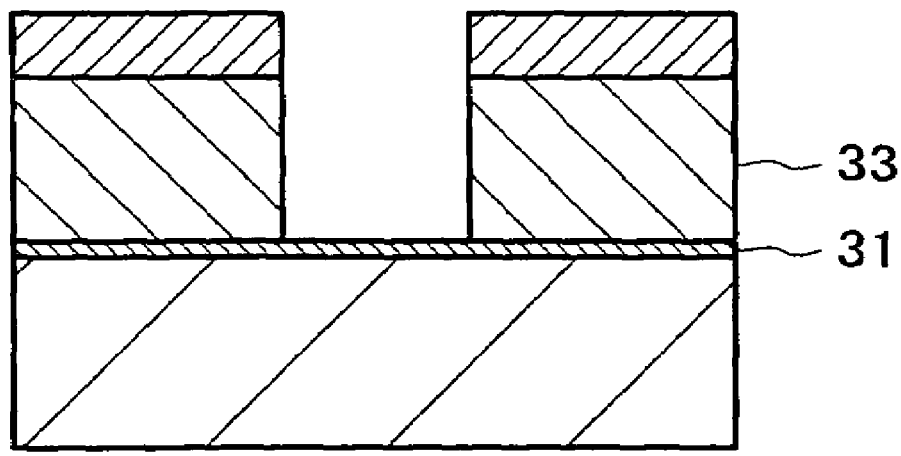

Next, as shown in FIG. 3B, a wet treatment using diluted hydrofluoric acid is conducted as an after-treatment.

According to the above procedure, the ashing treatment is carried out in the region where the ashing rate (O radical amount) predicted from the dissociation amount $EO_2$ of $O_2$ is small, whereby generation of an excess of O radicals can be securely prevented. Therefore, it is possible to restrain the damage to the SiOCH film 33 by an excess of O radicals, and to suppress the thickness of a denatured layer to 10 nm or below. This makes it possible to provide the SiOCH film 33 with the hole 39 with good shape accuracy.

<Semiconductor Device Manufacturing Method-2>

Here, another embodiment in which the above-described plasma processing method is applied to the case of forming a hole in an SiOCH film 33 used as a low-dielectric-constant film, like in the first example, will be described as a second example of the manufacturing method.

First, like in the description made referring to FIG. 3A above, an $SiO_2$ film 35 and an SiOCH film 33 are provided with a hole 39.

Thereafter, an ashing treatment for removing the resist 37 used to constitute the mask is conducted as a plasma processing. In the ashing treatment, hydrogen molecules ($H_2$) less reactive than oxygen are used as the molecular raw material gas, and helium (He) having a luminescence collision cross section closer to the dissociation collision cross section of the hydrogen molecules ($H_2$) is used as the rare gas. Incidentally, it has been confirmed that, also in the ashing treatment using such a gas system, the dissociation amount $EH_2$ of the hydrogen molecules ($H_2$) constituting the molecular raw material gas shows very good proportionality to the ashing rate (hence, to the H radical amount) when process conditions are varied in the following conditions:

Gas flow rates: $H_2$/He=200/10 sccm to 5000/250 sccm

Process atmosphere pressure: 1 to 100 Pa

HF power (Power): 500 to 5000 W, with the substrate temperature being 30° C.

Then, the dissociation amount $EH_2$ of the hydrogen molecules ($H_2$) is determined, and the ashing treatment is conducted while controlling the process conditions so as to attain a condition in the region where the ashing rate (H radical amount) predicted from the dissociation amount $EH_2$ is small. By carrying out the ashing treatment while controlling the process conditions in this manner, damages due to an excess of H radicals are restrained.

Thereafter, as shown in FIG. 3B, a wet treatment using diluted hydrofluoric acid is conducted as an after-treatment, in the same manner as in the first example.

Even in such a method, by controlling the process conditions based on the ashing rate (H radical amount) predicted from the dissociation amount $EH_2$ of $H_2$ constituting the molecular raw material gas, generation of an excess of H radicals can be securely prevented. As a result, the SiOCH film 33 can be provided with the hole 39 with good shape accuracy, like in the first example.

<Semiconductor Device Manufacturing Method-3>

Here, an embodiment in which the above-described plasma processing method is applied to nitriding of a gate oxide film will be described as a third example of the manufacturing method.

Figure 4A:
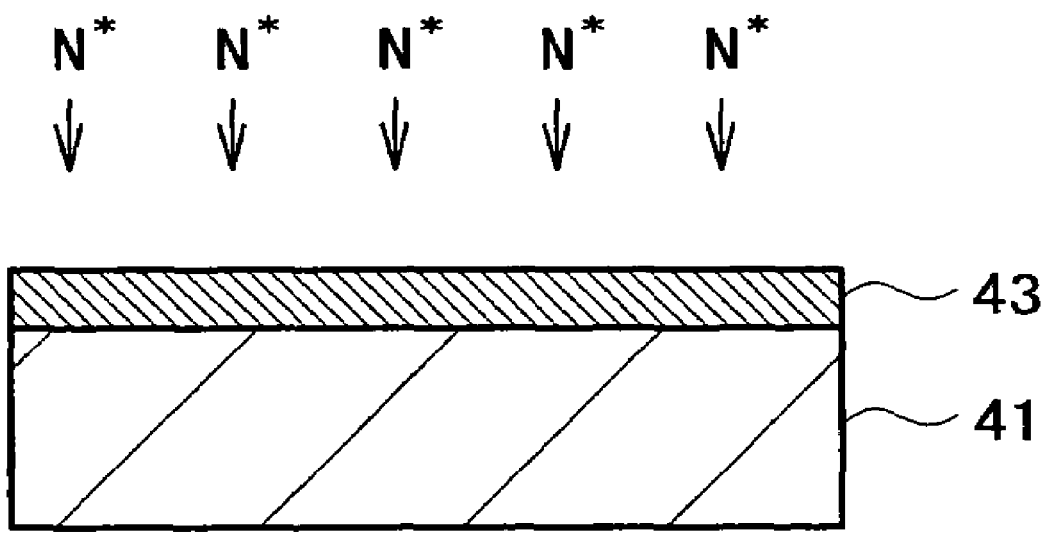
FIGS. 4A and 4B are sectional step diagrams illustrating a third embodiment of the method of manufacturing a semiconductor device according to the present invention.

First, as shown in FIG. 4A, a silicon oxide film 43 is formed on a silicon substrate 41. Then, the surface of the silicon oxide film 43 is exposed to nitrogen radicals, whereby the surface of the silicon oxide film 43 is subjected to a nitriding treatment (plasma processing). In this nitriding treatment, nitrogen molecules ($N_2$) are used as the molecular raw material gas, and helium (He) having a luminescence collision cross section closer to the dissociation collision cross section of the nitrogen molecules ($N_2$) is used as the rare gas. Incidentally, it has been confirmed that, also in the ashing treatment using such a gas system, the dissociation amount $EN_2$ of the nitrogen molecules ($N_2$) constituting the molecular raw material gas shows very good proportionality to the ashing rate (hence, to the N radical amount) when process conditions are varied in the following ranges:

Gas flow rates: $N_2$/He=200/10 sccm to 5000/250 sccm

Process atmosphere pressure: 1 to 100 Pa

HF power (Power): 500 to 5000 W, with the substrate temperature being 30° C. This is considered to be because the nitriding of the oxide film depends on the supply of N radicals and the formation of dangling bonds for coupling.

Then, the dissociation amount $EN_2$ of the nitrogen molecules ($N_2$) is determined, and the ashing treatment is carried out while controlling the process conditions so as to attain a condition in the region where the nitriding rate (N radical amount) predicted from the dissociation amount $EN_2$ is small.

By conducting the ashing treatment while controlling the process conditions in this manner, damages due to an excess of N radicals are restrained.

Figure 4B:
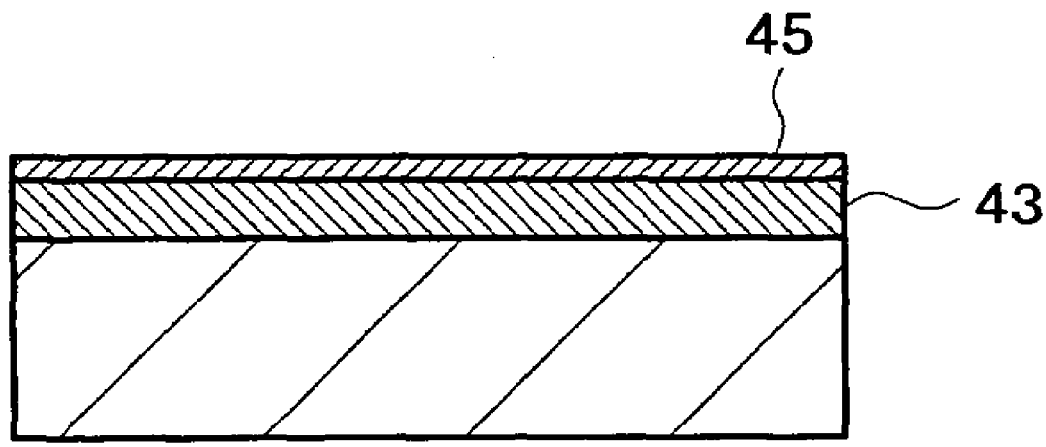

This results in the formation of a silicon nitride film 45 at a surface layer of the silicon oxide film 43, as shown in FIG. 4B.

Even in such a method, by controlling the process conditions based on the nitriding rate (N radical amount) predicted from the dissociation amount $EN_2$ of $N_2$ constituting the molecular raw material gas, the nitriding treatment can be performed with good process controllability.

<Semiconductor Device Manufacturing Method-4>

Here, an embodiment in which the above-described plasma processing method is applied to processing of a multi-layer resist will be described as a fourth example of the manufacturing method.

Figure 5A:
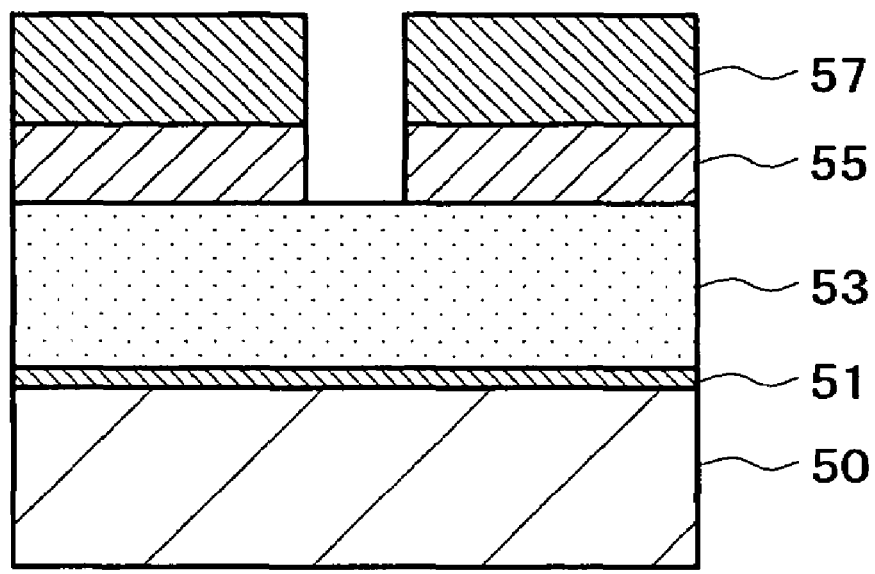
FIGS. 5A and 5B are sectional step diagrams illustrating a fourth embodiment of the method of manufacturing a semiconductor device according to the present invention.

First, as shown in FIG. 5A, a lower-layer resist 53 is formed on a substrate 50, with silicon oxide 51 therebetween, then an SOG film 55 is formed thereon, and, further, an upper-layer resist 57 for an ArF excimer laser beam is formed and patterned thereon. Then, the SOG film 55 is etched using the upper-layer resist 57 as a mask.

Figure 5B:
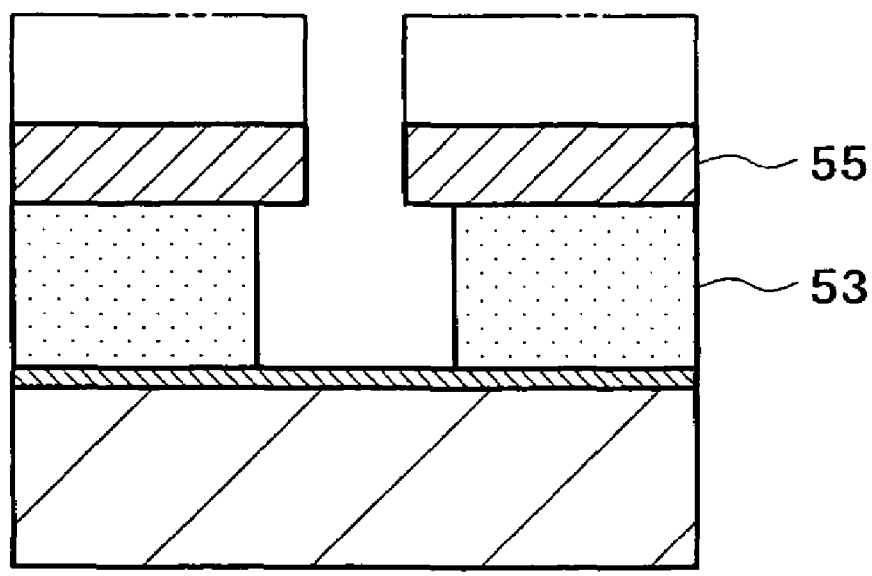
Figure 6A:
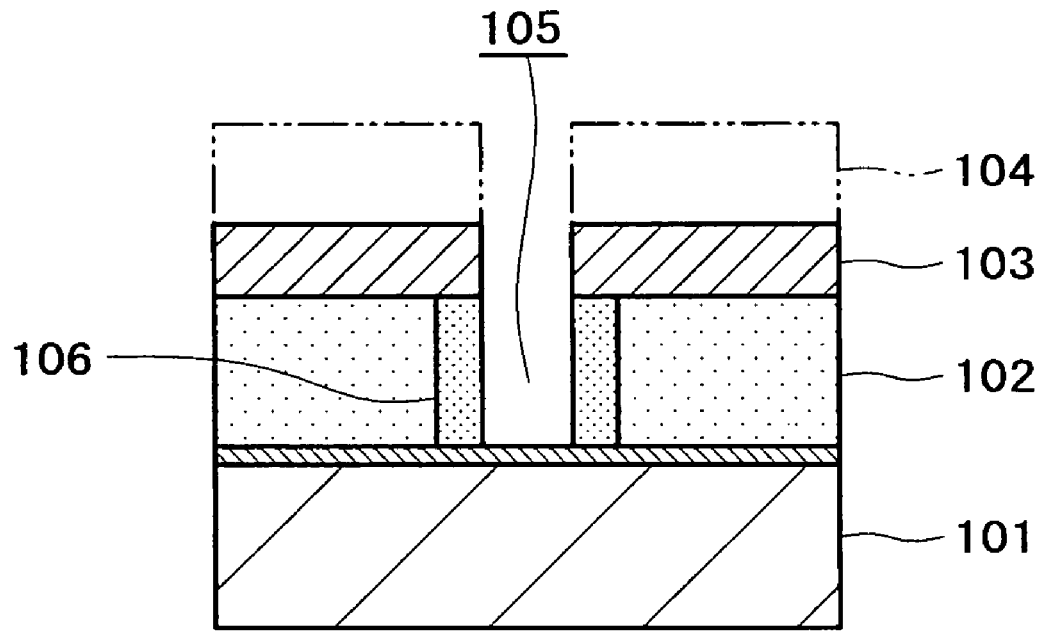
FIGS. 6A and 6B are sectional step diagrams illustrating one example of the method of manufacturing a semiconductor device to which the conventional plasma processing has been applied.
Figure 6B:
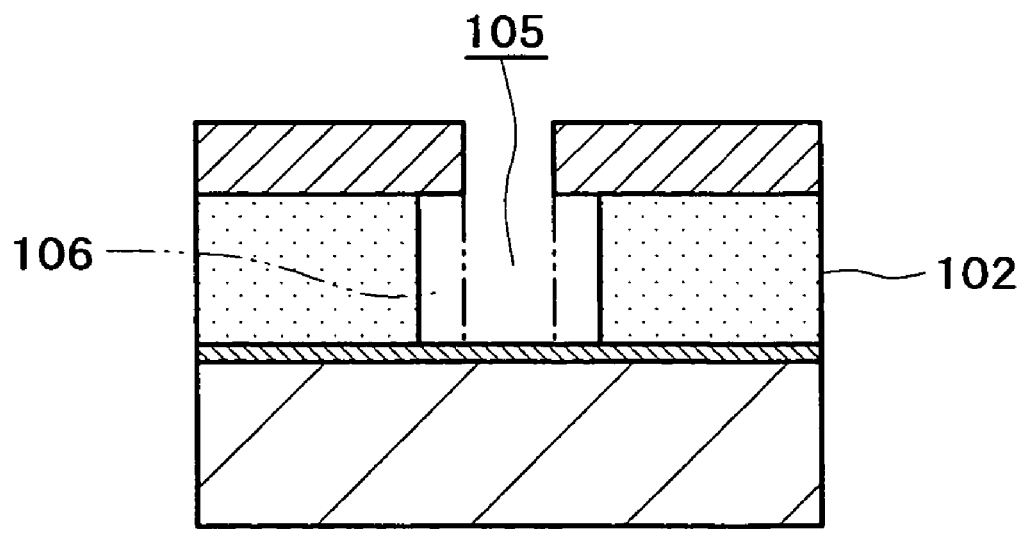
Figure 7:
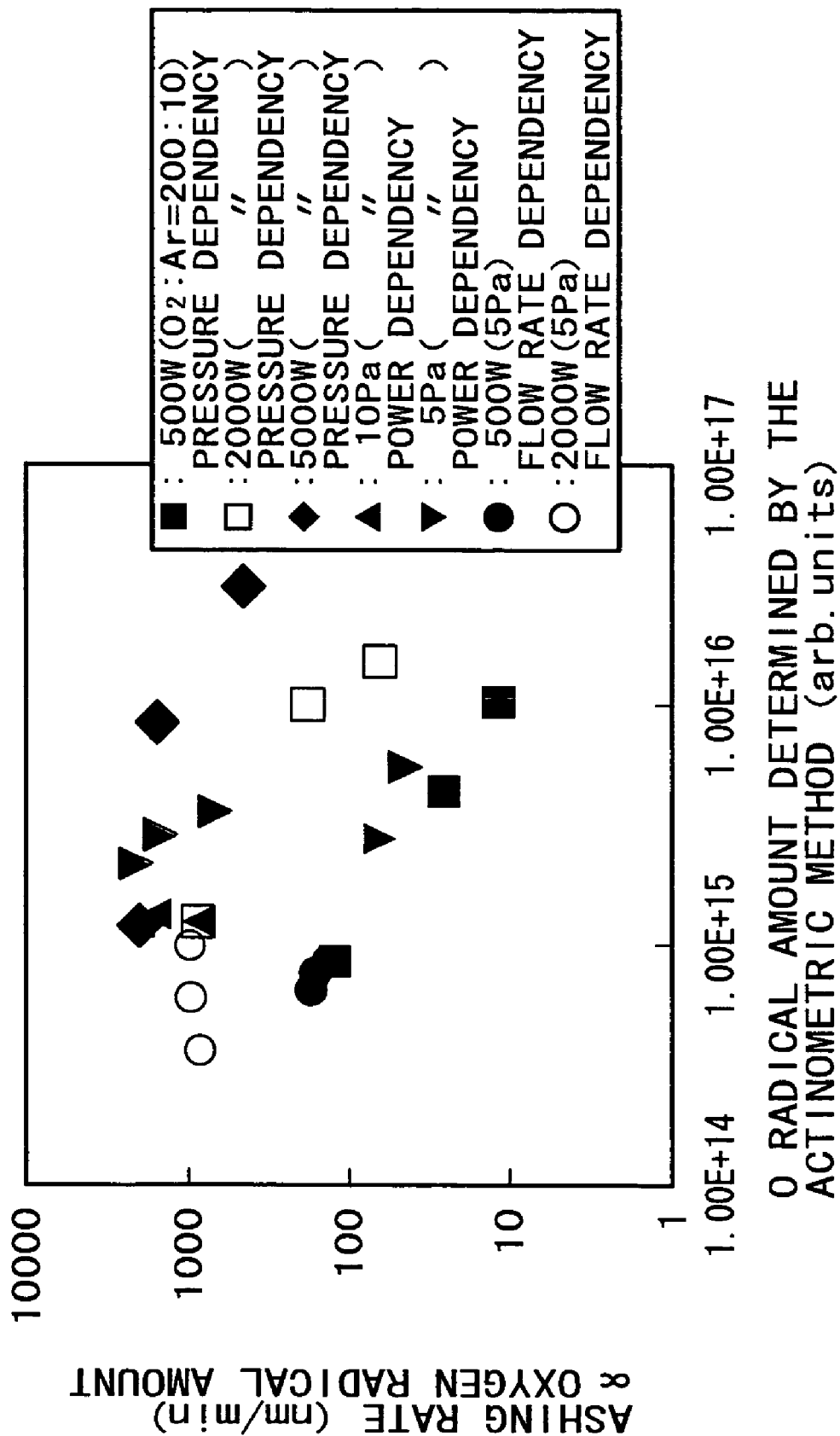
FIG. 7 shows a graph in which the oxygen radical amount determined by the actinometric method is taken on the axis of abscissas and the ashing rate of a resist is taken on the axis of ordinates.

Thereafter, as shown in FIG. 5B, an etching treatment for pattern etching of the lower-layer resist 53 by use of the SOG film 55 as a mask is carried out as a plasma processing.

In this ashing treatment, like in the first embodiment, the oxygen molecules ($O_2$) are used as the molecular raw material gas, and argon (Ar) is used as the rare gas. Then, the dissociation amount $EO_2$ of the oxygen molecules ($O_2$) is determined, and the etching treatment is conducted while controlling process conditions so as to bring the etching rate (O radical amount) predicted from the dissociation amount $EO_2$ to a predetermined etching rate, whereby the side etch amount on the lower side of the SOG film 55 is controlled. In this case, the process conditions are controlled in the following ranges:

Gas flow rates: $O_2$/Ar=500/50 sccm to 5000/250 sccm
Process atmosphere pressure: 1 to 100 Pa
HF power (Power): 500 to 5000 W, with the substrate temperature being 30° C.

According to the above procedure, the etching treatment is conducted while controlling the etching rate (O radical amount) predicted from the dissociation amount $EO_2$ of $O_2$, whereby the side etch amount is controlled accurately. This makes it possible to etch the lower-layer resist 53 with good shape accuracy.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A plasma monitoring method for detecting the amount of atomic radicals generated by dissociation of a molecular raw material gas during a plasma processing conducted by introducing said molecular raw material gas and a rare gas into a process atmosphere, said method comprising the steps of:

determining a dissociation degree of said molecular raw material gas from a partial pressure of said molecular raw material gas in said process atmosphere, a luminous intensity of said rare gas, and a partial pressure of said rare gas in said process atmosphere by the formula:

$E=P1\times(I/P2)$, where E is the dissociation degree, P1 is the partial pressure of said molecular raw material gas in said process atmosphere, I is the luminous intensity of said rare gas, and P2 is the partial pressure of said rare gas in said process atmosphere; and predicting the amount of said atomic radicals from said dissociation degree, based on the linear proportionality of a plasma processing rate from the dissociation degree, with the plasma processing rate linearly proportional to the amount of said atomic radicals.

2. A plasma monitoring method as set forth in claim 1, wherein said rare gas is one having a luminescence collision cross section close to a dissociation collision cross section of said molecular raw material gas, of rare gases.

3. The plasma processing method of claim 1 further comprising the step of controlling process conditions so as to bring said atomic radical amount to a predetermined atomic radical amount.

4. A method of manufacturing a semiconductor device by processing a surface of a substrate by plasma processing, said method comprising the steps of:

providing the substrate for the semiconductor device, comprising the surface upon which plasma processing is performed, introducing a molecular raw material gas and a rare gas into a process atmosphere in which to conduct said plasma processing for said surface of said substrate, determining a dissociation degree of said molecular raw material gas from a partial pressure of said molecular raw material gas in said process atmosphere, a luminous intensity of said rare gas, and a partial pressure of said rare gas in said process atmosphere by the formula:

$E=P1\times(I/P2)$, where E is the dissociation degree, P1 is the partial pressure of said molecular raw material gas in said process atmosphere, I is the luminous intensity of said rare gas, and P2 is the partial pressure of said rare gas in said process atmosphere;

predicting an amount of atomic radicals from said dissociation degree, based the linear proportionality of a plasma processing rate from the dissociation degree, with the plasma processing rate linearly proportional to the amount of said atomic radicals, and conducting said plasma processing while controlling process conditions so as to bring said atomic radical amount to a predetermined atomic radical amount.

5. A plasma processing system comprising:

a process chamber in which to conduct a plasma processing;

a luminescence detection and measuring unit for detecting luminescence at a specified wavelength in said process chamber and measuring a luminous intensity of a rare gas;

a first measuring unit for measuring a partial pressure of a molecular raw material gas in said process chamber;

a second measuring unit for measuring a partial pressure of the rare gas in said process chamber;

a computational unit for determining a dissociation degree of the molecular raw material gas from the partial pressure of said molecular raw material gas in said process chamber, the luminous intensity of the rare gas measured by said luminescence detection means unit, and the partial pressure of said rare gas in said process chamber, which calculates the dissociation degree by the formula:

$E=P1\times(I/P2)$, where E is the dissociation degree, P1 is the partial pressure of said molecular raw material gas in said process atmosphere, I is the luminous intensity of said rare gas, and P2 is the partial pressure of said rare gas in said process atmosphere;

and predicts an amount of atomic radicals from the said dissociation degree based on the linear proportionality of a plasma processing rate from the dissociation degree, with the plasma processing rate linearly proportional to the amount of said atomic radicals;

and a process controlling means unit for controlling process conditions based on the amount of atomic radicals predicted from said dissociation degree determined by said computational unit.

* * * * *